United States Patent
Lai et al.

(10) Patent No.: US 11,641,736 B2
(45) Date of Patent: May 2, 2023

(54) MEMORY DEVICE AND MANUFACTURING METHOD THEREOF

(71) Applicant: Fujian Jinhua Integrated Circuit Co., Ltd., Quanzhou (CN)

(72) Inventors: Huixian Lai, Quanzhou (CN); Chao-Wei Lin, Hsinchu County (TW); Chia-Yi Chu, Hsinchu (TW)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 17/151,669

(22) Filed: Jan. 19, 2021

(65) Prior Publication Data

US 2021/0225851 A1    Jul. 22, 2021

(30) Foreign Application Priority Data

Jan. 21, 2020 (CN) .......................... 202020139552.1

(51) Int. Cl.
*H01L 27/108* (2006.01)

(52) U.S. Cl.
CPC .. *H01L 27/10897* (2013.01); *H01L 27/10844* (2013.01)

(58) Field of Classification Search
CPC ......... H01L 27/10897; H01L 27/10844; H01L 27/10855; H01L 27/10894
See application file for complete search history.

(56) References Cited

U.S. PATENT DOCUMENTS

2013/0256769 A1* 10/2013 Jeong ................ H01L 27/10885
257/296
2017/0213834 A1* 7/2017 Wang ...................... H01L 28/00
2018/0261603 A1* 9/2018 Wang ................ H01L 27/10885

* cited by examiner

*Primary Examiner* — Edward Chin
(74) *Attorney, Agent, or Firm* — Winston Hsu

(57) ABSTRACT

The invention provides a memory and a forming method thereof. By connecting two node contact parts filled in two node contact windows at the edge and adjacent to each other, a large-sized combined contact can be formed, so that when preparing the node contact parts, the morphology of the combined contact at the edge position can be effectively ensured, and under the blocking protection of the combined contact with a large width, the rest of the node contact parts can be prevented from being greatly eroded, and the morphology accuracy of the independently arranged node contact parts can be improved, thereby being beneficial to improving the device performance of the formed memory.

20 Claims, 6 Drawing Sheets

MEMORY DEVICE AND MANUFACTURING METHOD THEREOF

BACKGROUND OF THE INVENTION

1. Field of the Invention

The invention relates to the technical field of semiconductors, in particular to a memory device and manufacturing method thereof.

2. Description of the Prior Art

Memory device, such as dynamic random access memory (DRAM), usually has a memory cell array including a plurality of memory cells arranged in an array. The memory device further comprises a storage capacitor for storing charges representing stored information, and the storage units can be electrically connected with the storage capacitor through a node contact part, thereby realizing the storage function of each storage unit.

At present, a method for preparing the node contact is, for example, to define a node contact window, and then fill the node contact window with a conductive material layer to form the node contact. When preparing the node contact, the conductive material layer fills the node contact window and extends out of the node contact window further, so that the conductive material layers filled in different node contact windows are connected with each other. Based on this, it is necessary to divide the conductive material layers by a patterning process to form mutually separated node contact parts.

However, when the conductive material layer is patterned to form the node contact, the pattern morphology of the node contact corresponding to the edge position is easily deformed, which will adversely affect the performance of the node contact, resulting in poor stability of the finally formed semiconductor device.

SUMMARY OF THE INVENTION

The purpose of the present invention is to provide a memory device to solve the problem that the node contact part at the edge position of the existing memory is prone to abnormal morphology, thus affecting the memory performance.

To solve the above technical problems, the present invention provides a memory device, including: a substrate on which a memory region and a peripheral region are defined, the peripheral region being located outside the memory region, a plurality of isolation pillars formed on the substrate and at least located in the memory region for defining a plurality of node contact windows in the memory region of the substrate, and the plurality of node contact windows are aligned and arranged in a plurality of rows in a predetermined direction, and a plurality of node contacts which fill the node contact windows and are arranged in a plurality of rows, and two node contacts filled in two adjacent node contact windows at the edge in each row are connected with each other, two node contacts which are connected with each other form a combined contact, and the node contact part located at the side of the combined contact far away from the peripheral region forms an independent contact, and each independent contact is filled with a node contact window.

Optionally, the isolation pillars are spaced between adjacent node contact parts; An isolation pillar spaced between two node contacts in the combined contact defines a first isolation pillar, and the two node contacts in the combined contact cover the first isolation pillar and are connected with each other on the top surface of the first isolation pillar.

Optionally, isolation pillars are spaced between adjacent independent contacts define second isolation pillars, and the top surfaces of the second isolation pillars are lower than the top surfaces of the independent contacts, and the memory device further comprises a first shielding layer, the first shielding layer is at least filled between the adjacent independent contacts and positioned on the second isolation pillar.

Optionally, an isolation pillar spaced between two node contact parts in the combined contact defines a first isolation pillar, and the top surface of the first isolation pillar is higher than the top surface of the second isolation pillar.

Optionally, the isolation pillars are also formed in the peripheral region and define third isolation pillars, and insulation filling pillars are spaced between adjacent third isolation pillars.

Optionally, the memory device further comprises an electrically conductive layer formed on at least part of the third isolation pillars, the top surface of part of the third isolation pillars covered by the electrically conductive layer is higher than the top surface of another part of the third isolation pillars not covered by the electrically conductive layer.

Optionally, the electrically conductive layer and the combined contact are arranged at intervals, and the top surfaces of the third isolation pillar and the insulation filling pillar located between the electrically conductive layer and the combined contact are lower than the top surface of the node contact part, so as to define a groove between the electrically conductive layer and the combined contact.

Optionally, the memory device further comprises a second shielding layer which is at least filled in the groove between the electrically conductive layer and the combined contact.

Optionally, the memory device further comprises a plurality of isolation spacers, and the isolation spacers are formed on the sidewalls of the grooves, an insulating film layer is also formed on the bottom wall of the groove, which covers the top surface of the third isolation pillar and the top surface of the insulation filling pillar in the groove and is connected with the bottom of the isolation spacer.

Optionally, the memory device further comprises a plurality of isolation spacers, the isolation spacers are formed on the sidewalls of the grooves, and the bottom parts of the isolation spacers cover the third isolation pillars, in the groove, the top surface of the third isolation pillar covered by the isolation spacer is higher than that of the third isolation pillar not covered by the isolation spacer.

In addition, the invention also provides a method for forming the memory, which comprises the following steps: providing a substrate, a memory region and a peripheral region are defined on the substrate, and the peripheral region is positioned outside the memory region, forming a plurality of isolation pillars on the substrate, the isolation pillars are at least located in the memory region to define a plurality of node contact windows in the memory region of the substrate, and the node contact windows are aligned and arranged in a plurality of rows in a predetermined direction, and a plurality of node contacts are formed, which fill the node contact windows and are arranged in multiple rows, and two node contacts filled with two node contact windows which are the most marginal and close to each other in each row are connected with each other, the two node contacts connected with each other form a combined contact, and the node contact part on the side of the combined contact far away from the peripheral region forms an independent contact, and each independent contact is filled with a node contact window.

Optionally, two node contact windows located at the edge and adjacent to each row of node contact windows are jointly defined as a combined contact window, and the node contact window located at the side of the combined contact window far from the peripheral region is defined as an independent contact window, the method for forming the node contact part comprises the following steps: forming a conductive material layer, the conductive material layer fills the node contact window and covers the top surface of the isolation pillar, forming a patterned mask layer on the conductive material layer, the patterned mask layer at least comprises a first pattern and a second pattern, the first pattern covers the combined contact window and the second pattern covers the independent contact window, and etching the conductive material layer with the patterned mask layer as a mask to form a plurality of node contacts, two node contacts filled in the combined contact window are connected with each other to form the combined contact, and node contacts filled in the independent contact window are separated from each other to form the independent contact.

In some embodiment of the present invention, a memory device is disclosed, the memory device includes a substrate, a memory region and a peripheral region are defined thereon, the peripheral region being located outside the memory region, a plurality of isolation pillars formed on the substrate and at least located in the memory region for defining a plurality of node contact windows in the memory region of the substrate, and a plurality of node contacts, the plurality of node contacts fill the node contact windows and arranged in a plurality of rows, at least two of the plurality of node contacts filled in two adjacent node contact windows are connected with each other and to form a combined contact, and a plurality of the node contacts located beside the combined contact are defined as a plurality of independent contacts, and each independent contact is filled with a node contact window.

In some embodiment of the present invention, the isolation pillars are disposed between adjacent node contacts, an isolation pillar disposed under the combined contact is defined as a first isolation pillar, and the two node contacts of the combined contact are connected with each other on a top surface of the first isolation pillar.

In some embodiment of the present invention, the isolation pillar disposed between adjacent independent contacts are defined as a second isolation pillar, and a top surface of the second isolation pillar is lower than a top surface of each independent contact.

In some embodiment of the present invention, an isolation pillar disposed under the combined contact is defined as a first isolation pillar, and a top surface of the first isolation pillar is higher than a top surface of the second isolation pillar.

In some embodiment of the present invention, the isolation pillars are further formed in the peripheral region, and the isolation pillars disposed in the peripheral region are defined as a plurality of third isolation pillars, and at least one insulation filling pillar is disposed between two adjacent third isolation pillars.

In some embodiment of the present invention, the memory device further includes an electrically conductive layer formed on at least part of the third isolation pillars, a top surface of part of the third isolation pillars covered by the electrically conductive layer is higher than a top surface of another part of the third isolation pillars not covered by the electrically conductive layer.

In some embodiment of the present invention, the top surface of parts of the third isolation pillars and the top surface of parts of the insulation filling pillars located are lower than the top surface of the electrically conductive layer and the top surface of the combined contact, so as to define a groove between the electrically conductive layer and the combined contact.

In some embodiment of the present invention, the memory device further includes a first shielding layer, the first shielding layer is at least filled between the adjacent independent contacts and positioned on the second isolation pillar, and a second shielding layer, the second shielding layer is at least filled in the groove between the electrically conductive layer and the combined contact.

In some embodiment of the present invention, the memory device further includes an U-shaped insulating film layer disposed beside the combined contact, the U-shaped insulating film layer covers the top surface of the third isolation pillar and the top surface of the insulation filling pillar.

In some embodiment of the present invention, the memory device further includes at least one isolation spacers disposed beside the combined contact, and the at least one isolation spacers covers parts of the third isolation pillars, the top surface of the third isolation pillar covered by the isolation spacer is higher than the top surface of the third isolation pillar not covered by the isolation spacer.

In some embodiment of the present invention, a method for forming a memory device is disclosed, the method including: forming a substrate, a memory region and a peripheral region are defined thereon, the peripheral region being located outside the memory region, forming a plurality of isolation pillars formed on the substrate and at least located in the memory region for defining a plurality of node contact windows in the memory region of the substrate, and forming a plurality of node contacts, the plurality of node contacts fill the node contact windows and arranged in a plurality of rows, at least two of the plurality of node contacts filled in two adjacent node contact windows are connected with each other and to form a combined contact, and a plurality of the node contacts located beside the combined contact are defined as a plurality of independent contacts, and each independent contact is filled with a node contact window.

In some embodiment of the present invention, the isolation pillars are disposed between adjacent node contacts, an isolation pillar disposed under the combined contact is defined as a first isolation pillar, and the two node contacts of the combined contact are connected with each other on a top surface of the first isolation pillar.

In some embodiment of the present invention, the isolation pillar disposed between adjacent independent contacts are defined as a second isolation pillar, and a top surface of the second isolation pillar is lower than a top surface of each independent contact.

In some embodiment of the present invention, an isolation pillar disposed under the combined contact is defined as a first isolation pillar, and a top surface of the first isolation pillar is higher than a top surface of the second isolation pillar.

In some embodiment of the present invention, the isolation pillars are further formed in the peripheral region, and the isolation pillars disposed in the peripheral region are defined as a plurality of third isolation pillars, and at least one insulation filling pillar is disposed between two adjacent third isolation pillars.

In some embodiment of the present invention, the memory device further includes forming an electrically conductive layer formed on at least part of the third isolation pillars, a top surface of part of the third isolation pillars covered by the electrically conductive layer is higher than a top surface of another part of the third isolation pillars not covered by the electrically conductive layer.

In some embodiment of the present invention, the top surface of parts of the third isolation pillars and the top surface of parts of the insulation filling pillars located are lower than the top surface of the electrically conductive layer and the top surface of the combined contact, so as to define a groove between the electrically conductive layer and the combined contact.

In some embodiment of the present invention, the memory device further includes forming a first shielding layer, the first shielding layer is at least filled between the adjacent independent contacts and positioned on the second isolation pillar, and forming a second shielding layer, the second shielding layer is at least filled in the groove between the electrically conductive layer and the combined contact.

In some embodiment of the present invention, the memory device further includes forming an U-shaped insulating film layer beside the combined contact, the U-shaped insulating film layer covers the top surface of the third isolation pillar and the top surface of the insulation filling pillar.

In some embodiment of the present invention, the memory device further includes forming at least one isolation spacers beside the combined contact, and the at least one isolation spacers covers parts of the third isolation pillars, the top surface of the third isolation pillar covered by the isolation spacer is higher than the top surface of the third isolation pillar not covered by the isolation spacer.

In the memory device provided by the invention, two node contact parts filled in two adjacent node contact windows at the edge in each row are connected with each other, so that a combined contact with larger size can be formed, therefore, when preparing the node contact parts, two node contact parts formed at the edge position can be connected with each other to form a combined contact with larger size, so that the appearance of the combined contact at the edge position can be effectively guaranteed. In addition, under the blocking protection of the combined contacts with larger width, the node contact parts arranged inside can be further prevented from being eroded greatly, and the appearance precision of other node contact parts is improved, thereby being beneficial to improving the device performance of the formed memory.

These and other objectives of the present invention will no doubt become obvious to those of ordinary skill in the art after reading the following detailed description of the preferred embodiment that is illustrated in the various figures and drawings.

DETAILED DESCRIPTION

The memory and its forming method proposed by the present invention will be further described in detail with reference to the drawings and specific embodiments. Advantage and features of that present invention will become more apparent from the follow description. It should be noted that the drawings are all in a very simplified form and use imprecise scale, which is only for the purpose of conveniently and clearly assisting in explaining the embodiments of the present invention.

Figure 1A:
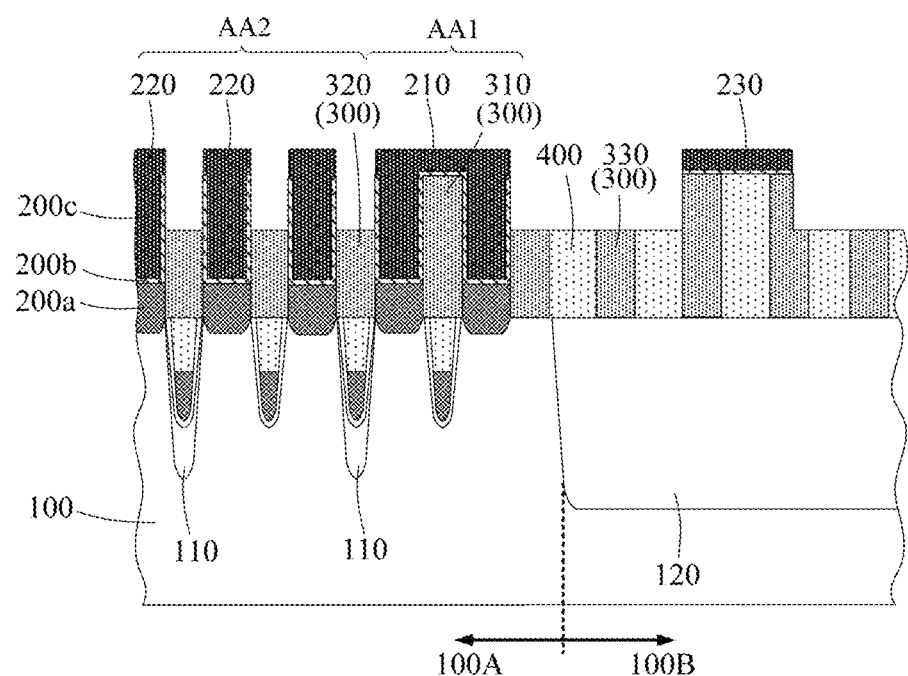
FIG. 1a is a schematic cross-sectional view of a memory device in embodiment 1 of the present invention, in which an isolation pillar and a node contact part are formed.
Figure 1B:
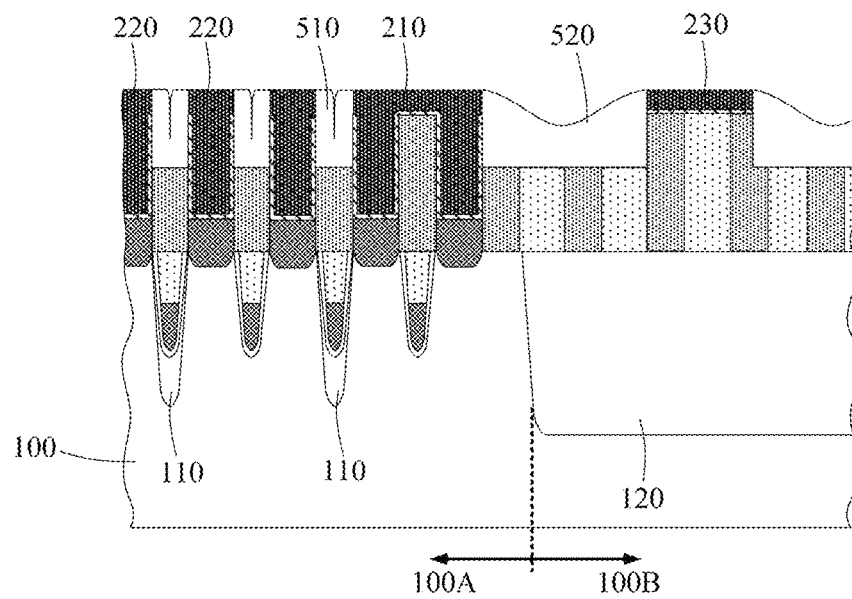
FIG. 1b is a schematic cross-sectional view of a memory device with a shielding layer formed in the first embodiment of the present invention.

FIG. 1a is a schematic cross-sectional view of a memory device in the first embodiment of the present invention in which an isolation pillar and a node contact part are formed, and FIG. 1b is a schematic cross-sectional view of a memory device in the first embodiment of the present invention in which a shielding layer is formed. Referring to FIGS. 1a and 1b, the memory device includes a substrate 100, a plurality of isolation pillars 300 formed on the substrate 100, and a plurality of node contacts.

Specifically, a plurality of active areas are formed in the substrate 100, which are arranged in an array, and adjacent active areas can be separated from each other by the first trench isolation structure 110, and a memory cell is formed on the active areas based on the active areas. The active areas arranged at the edge position define the first active area AA1, and the active areas surrounded by the first active area AA1 define the second active area AA2.

It should be noted that, due to the limitation of the existing semiconductor manufacturing process, the quality of the active area (for example, the first active area AA1) arranged at the edge position among the formed active areas is low. If the memory cells are further manufactured on the low-quality active areas, the device performance of the memory cells formed based on the active areas at the edge position will be affected, and the memory cells with performance defects will need to be discarded, which will inevitably lead to the waste of cost.

Based on this, in this embodiment, at least the active area located at the edge position can be defined as a non-functional active area, which is not used to form a memory cell, that is, the non-functional active area includes the first active area AA1. And the second active area AA2 surrounded by the first active area AA1 is at least partially defined as a functional active area for forming an effective memory cell.

With continued reference to FIG. 1a, in this embodiment, a memory region 100A and a peripheral region 100B located outside the memory region 100A are defined on the substrate 100, and a plurality of active areas are formed in the memory region 100A. A second trench isolation structure 120 is formed in the area where the peripheral region 100B is connected with the memory region 100A, so as to isolate the semiconductor devices in the memory region 100A from those in the peripheral region 100B. It should be recognized that the first active area AA1 arranged at the edge position among the plurality of active areas is correspondingly close to the peripheral region 100B.

It can be considered that the active area closest to the peripheral region 100B among the plurality of active areas defines a first active area AA1, and the active area located on the side of the first active area away from the peripheral region 100B among the plurality of active areas defines a second active area AA2.

With continued reference to FIG. 1a, a plurality of isolation pillars 300 are formed on the substrate 100 and located in the memory region 100A for defining a plurality of node contact windows on the substrate 100, and the node contact windows are aligned in a plurality of rows in a predetermined direction. It can be considered that the plurality of isolation pillars 300 include isolation pillars partially extending along the first direction and isolation pillars partially extending along the second direction, so that the plurality of node contact windows can be surrounded by isolation pillars intersecting in different directions.

Furthermore, among the plurality of isolation pillars 300, the isolation pillars extending along the first direction and the isolation pillars extending along the second direction are perpendicular to each other, so that the defined plurality of node contact windows can be aligned in the first direction and the second direction. At this time, it can be considered that a plurality of node contact windows are arranged in multiple rows in the first direction and the second direction.

With continued reference to FIG. 1a, the node contacts fill the node contacts and are correspondingly arranged in multiple rows, and the node contacts are electrically connected with the corresponding active areas. Two node contacts filled with two node contact windows which are the most marginal and close to each other in each row are connected with each other.

As described above, in this embodiment, at least the active area located at the edge position is defined as a non-functional active area, and at this time, the node contact part located at the edge position and connected with the non-functional active area can also be correspondingly defined as a non-functional contact part. Therefore, even if the two node contacts located at the edge are connected with each other, the device performance of the whole memory device will not be affected.

In this embodiment, two node contacts which are filled with the two most marginal node contact windows in each row and connected with each other are defined as a combined contact 210, and the node contacts located on the side of the combined contact 210 away from the peripheral region 100B in each row are defined as independent contacts 220, and each independent contact 220 is filled with a node contact window.

That is, the width dimension of the combined contact 210 composed of interconnected node contact parts is larger than that of the independent contact 220. For example, the width dimension D1 of the combined contact 210 may be greater than twice the width dimension D2 of the independent contact portion 220 (i.e., D1>2*D2).

It should be noted that, in the traditional process, when the same conductive material layer is patterned to divide the conductive material layer to form mutually separated node contacts, the node contacts at the edge positions are usually subjected to a large etching attack, which leads to the node contacts at the edge positions being easily eroded and deformed. Based on this, in this embodiment, the active area at the edge position is defined as a non-functional active area, and the node contacts at the edge position are connected with each other to form the combined contact 210 with a larger size, so that the morphology of the combined contact 210 can be guaranteed even if the combined contact 210 is subjected to a larger etching attack. In addition, under the blocking protection of the combined contact 210 with large width, the problem that the independent contact 220 adjacent to the combined contact 210 is excessively eroded can be effectively alleviated.

Further, the node contact portion includes a first conductive layer 200a, a second conductive layer 200b, and a third conductive layer 200c. The first conductive layer 200a fills the bottom of the node contact window, and the second conductive layer 200b is located between the first conductive layer 200a and the third conductive layer 200c, and covers the bottom surface and at least part of the sidewall of the third conductive layer 200c.

It should be recognized that the node contact window is surrounded by the isolation pillar 300, and at this time, the isolation pillar 300 is correspondingly spaced between adjacent node contacts. Specifically, an isolation pillar 300 spaced between two node contacts in the combined contact 210 defines a first isolation pillar 310, and the two node contacts in the combined contact 210 cover the first isolation pillar 310 and are connected to each other on the top surface of the first isolation pillar 310. In this embodiment, in the combined contact 210, two second conductive layers 200b of two node contacts are connected to each other on the top surface of the first isolation pillar 310, and two third conductive layers 200c of two node contacts are connected to each other above the first isolation pillar 310.

And, the isolation pillars 300 spaced between the adjacent independent contacts 220 define second isolation pillars 320, and the top surfaces of the second isolation pillars 320 are lower than the top surfaces of the independent contacts 220. In this embodiment, the top surface of the second isolation pillar 320 is lower than the top surface of the first isolation pillar 310.

Referring to FIGS. 1a and 1b, in this embodiment, the top surfaces of the independent contact portion 220 and the combined contact 210 are flush, and at this time, both the independent contact portion 220 and the combined contact 210 protrude relative to the second isolation pillar 320. For this reason, the memory device in this embodiment further includes a first shielding layer 510, which is at least filled between the adjacent independent contacts 220 and located on the second isolation pillar 320. Furthermore, the first shielding layer 510 is also spaced between the independent contact 220 and the combined contact 210.

In addition, the isolation pillar 300 may be further formed in the peripheral region 100B to form a third isolation pillar 330, and at this time, for example, a peripheral contact window may be defined in the peripheral region 100B. And, the peripheral contact window is filled with insulation filling pillars 400, in other words, the insulation filling pillars 400 are spaced between the adjacent third isolation pillars 330.

Optionally, the memory device further includes an electrically conductive layer 230 formed on at least part of the third isolation pillar 330. The top surfaces of some third isolation pillars covered by the electrically conductive layer 230 are higher than the top surfaces of other third isolation pillars not covered by the electrically conductive layer 230. In this embodiment, the electrically conductive layer 230 covers the top surface of the third isolation pillar 330 and also extends to cover the adjacent insulation contact pillar 400, and the top surfaces of the third isolation pillar and insulation contact pillar covered by the electrically conductive layer 230 are higher than those of the third isolation pillar and insulation contact pillar not covered by the electrically conductive layer 230.

In this embodiment, the electrically conductive layer 230 closest to the memory region 100A and the combined contact 210 are spaced apart from each other, and the top surfaces of the third isolation pillar 330 and the insulation filling pillar 400 located between the electrically conductive layer 230 and the combined contact 210 are lower than the top surface of the node contact, so as to define a groove between the electrically conductive layer 230 and the combined contact 210. More specifically, the top surfaces of the third isolation pillar 330 and the insulation filling pillar 400 located between the electrically conductive layer 230 and the combined contact 210 are lower than the top surfaces of the third isolation pillar 330 and the insulation filling pillar 400 covered by the electrically conductive layer 230.

It should be noted that the number of the third isolation pillars 330 and the number of the insulation filling posts 400 between the electrically conductive layer 230 and the combined contact 210 can be adjusted according to actual conditions (i.e., the number of the third isolation pillars 330 and the number of the insulation filling posts 400 in the grooves can be adjusted according to actual conditions). For example, in this embodiment, there are two third isolation pillars 330 and two insulation filling posts 400 between the electrically conductive layer 230 and the combined contact 210. Furthermore, the number of the third isolation pillars and the insulation filling pillars covered by the electrically conductive layer 230 can be adjusted to one or more correspondingly. In this embodiment, two third isolation pillars and one insulation filling pillar are covered under the electrically conductive layer 230.

Specifically, the top surfaces of the third isolation pillar 330 and the insulating contact pillar 400 that are not covered by the electrically conductive layer 230 may be flush with the top surface of the second isolation pillar 320, for example. And, the top surfaces of the third isolation pillar 330 and the insulating contact pillar 400 covered by the electrically conductive layer 230 may be, for example, flush with the top surface of the first isolation pillar 310.

With continued reference to FIGS. 1a and 1b, the electrically conductive layer 230 includes a first electrically conductive layer and a second electrically conductive layer, and the first electrically conductive layer and the second electrically conductive layer are sequentially stacked on the third isolation pillar 330 and the insulation filling pillar 400.

In this case, the second conductive layer 300b and the third conductive layer 300c in the electrically conductive layer 230 and the node contact portion can be simultaneously prepared and formed on the basis of the same conductive material layer by a patterning process. The formation method of the electrically conductive layer 230 and the node contact will be described in detail below.

With continued reference to FIG. 1b, the memory device further includes a second shielding layer 520, which is at least filled in the groove between the electrically conductive layer 230 and the combined contact 210.

In a further scheme, a plurality of electrically conductive layers 230 can be formed in the peripheral region 100B, and the heights of the third isolation pillars 330 and the insulation filling pillars 400 between the adjacent electrically conductive layers 230 are correspondingly lower. Based on this, the second shielding layer 520 is also filled between the adjacent electrically conductive layers 230.

Figure 2:
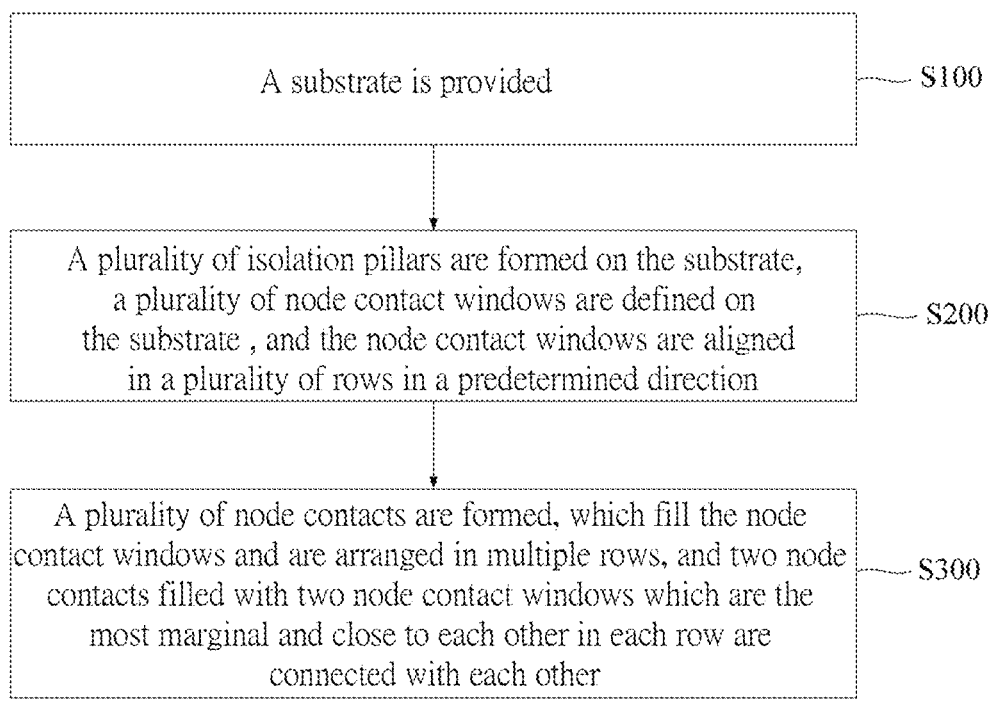
FIG. 2 is a flow chart of a method for forming a memory device in embodiment 1 of the present invention.

Next, the method of forming the memory described above in this embodiment will be described in detail with reference to FIG. 2 and FIGS. 3a to 3e. FIG. 2 is a schematic flow chart of a method for forming a memory device in embodiment 1 of the present invention, and FIGS. 3a to 3e are schematic structural diagrams of the memory device in the preparation process of embodiment 1 of the present invention.

Figure 3A:
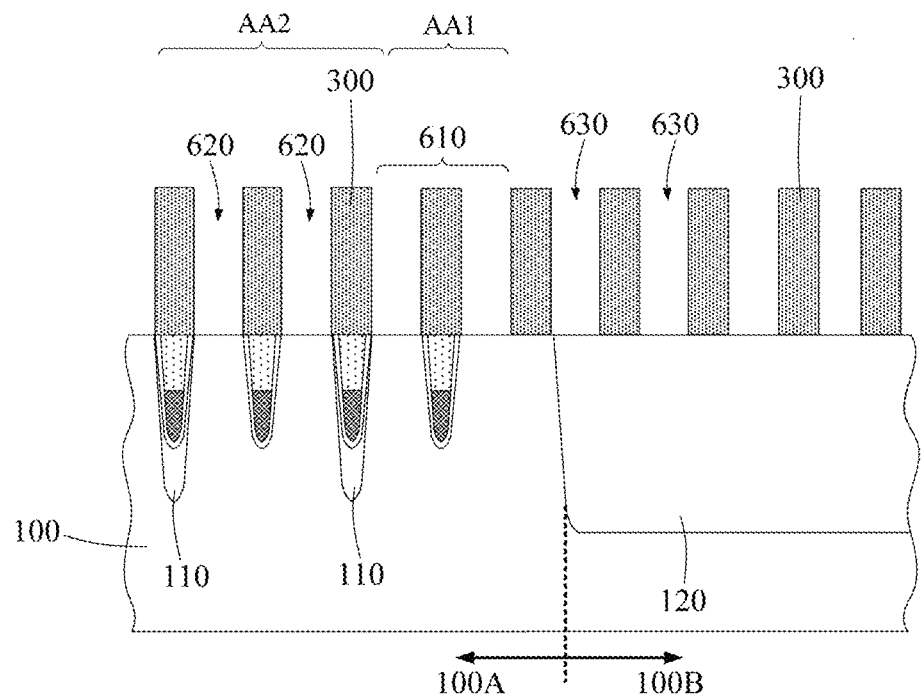
FIGS. 3a, 3b, 3c, 3d and 3e are schematic structural diagrams of the memory device in the first embodiment of the present invention during its preparation.

In step S100, referring specifically to FIG. 3a, a substrate 100 is provided, on which a memory region 100A and a peripheral region 100B are defined, and the peripheral region 100B is located outside the memory region 100A.

Specifically, a plurality of active areas are formed in the memory region 100A of the substrate 100, and adjacent active areas can be separated from each other by a first trench isolation structure 110, for example. Among the plurality of active areas, the active area arranged at the edge position defines a first active area AA1, and the active area located on the side of the first active area AA1 far away from the peripheral region defines a second active area AA2.

In this embodiment, the active area located at the edge position can be defined as a non-functional active area, which is not used to form a memory cell, that is, the non-functional active area includes the first active area AA1. And the second active area AA2 surrounded by the first active area AA1 is at least partially defined as a functional active area for forming a memory cell.

Furthermore, a second trench isolation structure 120 may be formed in the substrate around the active area array, so that the active area array in the memory region 100A can be isolated from devices in the peripheral region 100B.

In step S200, as shown in FIG. 3a, a plurality of isolation pillars 300 are formed on the substrate 100, and a plurality of node contact windows are defined on the substrate 100, and the node contact windows are aligned in a plurality of rows in a predetermined direction. In this embodiment, the plurality of node contact windows are formed in the memory region 100A.

As described above, the plurality of isolation pillars 300 may include isolation pillars extending partially along the first direction and isolation pillars extending partially along the second direction, and then the plurality of node contact windows may be surrounded by isolation pillars intersecting in different directions. The isolation pillars extending along the first direction and the isolation pillars extending along the second direction are perpendicular to each other, so that a plurality of defined node contact windows can be aligned in the first direction and the second direction. At this time, it can be considered that a plurality of node contact windows are arranged in multiple rows in the first direction and the second direction.

In this embodiment, two node contact windows located at the edge and adjacent to each other in each row are jointly defined as a combined contact window 610, and the node contact window located at the side of the combined contact window 610 away from the peripheral region 100B in each row is defined as an independent contact window 620.

With continued reference to FIG. 3a, a plurality of isolation pillars 300 are formed in the memory region 100A to define a plurality of node contact windows (including combined contact windows 610 and independent contact windows 620) in the memory region 100A, and the isolation pillars 300 are also formed in the peripheral region 100B to define peripheral contact windows 630 in the peripheral region 100B. In addition, in this step, the top surfaces of the plurality of isolation pillars 300 (including the isolation pillars formed in the memory region 100A and the isolation pillars formed in the peripheral region 100B) are flush.

Figure 3B:
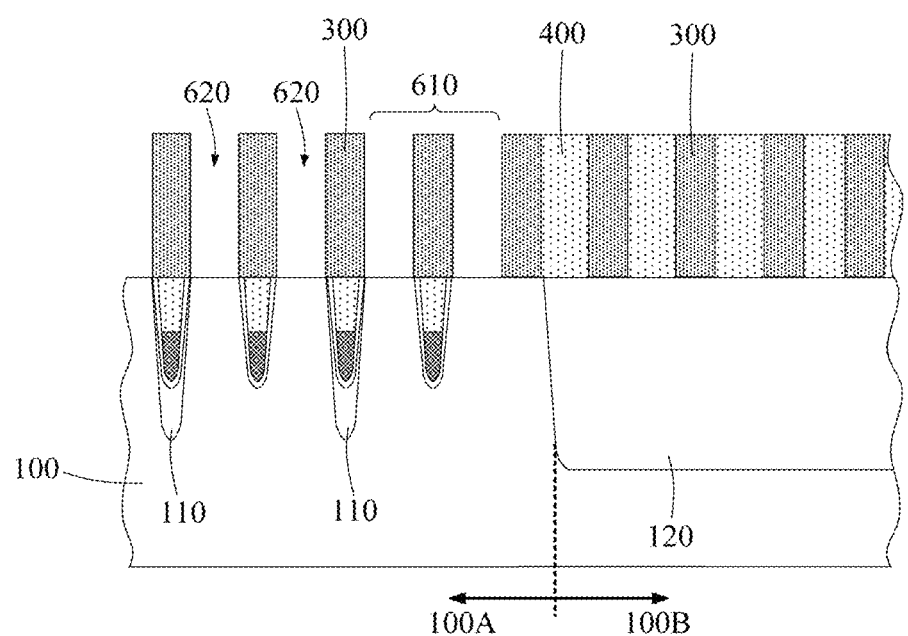

In a further scheme, as shown in FIG. 3b, the peripheral contact window 630 is further filled with an insulating filling pillar 400.

In this embodiment, after defining the node contact window, the bottom of the node contact window is further etched so that the bottom of the node contact window further extends into the active area of the substrate 100.

Figure 3C:
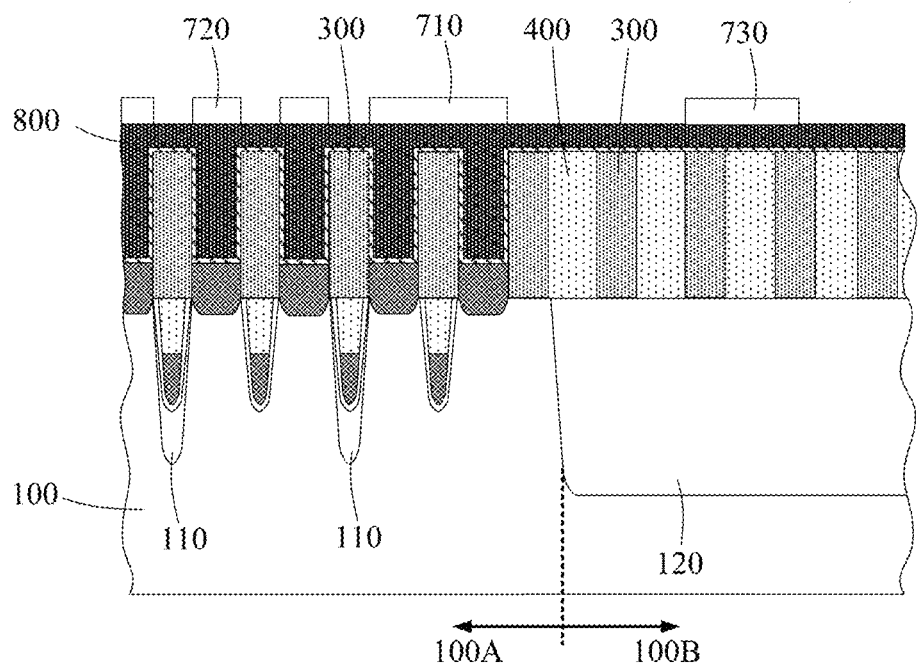
Figure 3D:
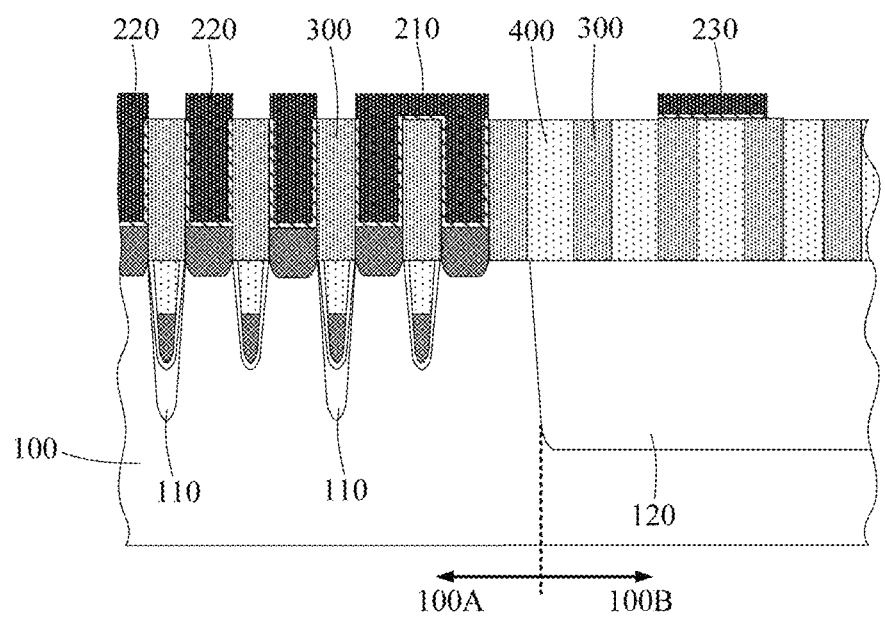

In step S300, as shown in FIG. 3c to FIG. 3d, a plurality of node contacts are formed, which fill the node contact windows and are arranged in multiple rows, and two node contacts filled with two node contact windows which are the most marginal and close to each other in each row are connected with each other.

In this embodiment, the two node contacts which are filled with the two most marginal node contact windows in each row and connected with each other are jointly defined as combined contact 210, and the node contacts located on the side of the combined contact 210 away from the peripheral region 100B in each row are defined as independent contacts 220, and each independent contact 220 is filled with a node contact window. It can also be understood that the two node contacts filled in the combined contact window 610 are connected with each other to form the combined contact 210, and the node contacts filled in the independent contact window 620 form the independent contact 220.

With continued reference to FIG. 3d, the node contact includes a first conductive layer 200a, a second conductive layer 200b and a third conductive layer 200c. The first conductive layer 200a fills the bottom of the node contact window to electrically connect with the active area. The second conductive layer 200b covers the top surface of the first conductive layer 200a and the sidewall of the node contact window. The third conductive layer 200c is formed on the second conductive layer 200b and fills the node contact window, and the third conductive layer 200c also extends upward out of the node contact window to protrude from the node contact window.

Specifically, the forming method of the node contact part comprises the following steps.

The first step, specifically referring to FIG. 3c, is to form a first conductive layer 200a on the bottom of the node contact window. The material of the first conductive layer 200a includes polysilicon, for example.

In the second step, as shown in FIG. 3c, a conductive material layer 800 is formed, which fills the node contact window and covers the top surface of the isolation pillar 300. In this embodiment, the conductive material layer 800 is formed not only in the memory region 100A but also in the peripheral region 100B to cover the isolation pillars 300 and the insulation filling pillars 400 in the peripheral region 100B.

The conductive material layer 800 may specifically include a lower conductive material layer and an upper conductive material layer which are stacked up and down. Specifically, the material of the lower conductive material layer includes titanium nitride, the upper conductive material layer is a metal layer, and the metal layer may further include tungsten.

In this embodiment, the conductive material layer 800 may be a planarized film layer, so as to utilize the subsequent patterning accuracy of the conductive material layer 800.

In the third step, as shown in FIG. 3c, a patterned mask layer is formed on the conductive material layer 800. The patterned mask layer is, for example, a patterned photoresist layer.

Specifically, the patterned mask layer at least includes a first pattern 710 and a second pattern 720, both of which are formed in the memory region 100A. The first pattern 710 covers the top of the combined contact window to define the pattern of the combined contact, and at this time, the first pattern 710 also covers the isolation pillar 300 between two node contact windows in the combined contact window. And, the second pattern 720 covers the independent contact window to define the pattern of the independent contact.

Furthermore, the width dimension of the first pattern 710 is correspondingly larger than that of the second pattern 720 (for example, the width dimension of the first pattern 710 is twice as large as that of the second pattern 720).

It should be noted that when the patterned mask layer is formed, the first pattern 710 at the edge position will also be over-developed, thus affecting the pattern accuracy of the first pattern 710. In this embodiment, the width of the first pattern 710 is made larger than that of the second pattern 720, so that it can be ensured that the first pattern 710 still meets the size requirements even on the basis of over-development. In addition, under the blocking protection of the first pattern 710 with large width, the over-development of the second pattern 720 is avoided, and the pattern accuracy of the second pattern 720 is guaranteed.

Optionally, the patterned mask layer further includes a third pattern 730, which is formed in the peripheral region 100B to define the pattern of the electrically conductive layer in the peripheral region 100B.

The fourth step, specifically referring to FIG. 3d, etches the conductive material layer 800 with the patterned mask layer as a mask, so that the conductive material layers corresponding to the contact windows of different nodes are separated from each other, thereby forming a combined contact 210 and an independent contact 220 separated from each other. At this time, the width dimension of the combined contact 210 is correspondingly larger than that of the independent contact portion 220. For example, the width dimension D1 of the combined contact 210 may be larger than twice the width dimension D2 of the independent contact portion 220 (i.e., D1>2*D2).

Similarly, when the conductive material layer 800 is etched, the node contact at the edge position will be greatly attacked by etching, which will cause the node contact at the edge position to be easily eroded and deformed. Based on this, in this embodiment, two node contacts located at the edge and adjacent to each other are connected to form a combined contact 210 with a larger size, so that the morphology of the combined contact 210 can be guaranteed even if the combined contact 210 is subjected to a larger etching attack. In addition, under the blocking protection of the combined contact 210 with large width dimension, the problem that the independent contact 220 adjacent to the combined contact 210 is excessively eroded can also be effectively alleviated.

In this embodiment, when the conductive material layer 800 is etched using the patterned mask layer as a mask, an electrically conductive layer 230 corresponding to the third pattern 730 is further formed in the peripheral region 100B.

Figure 3E:
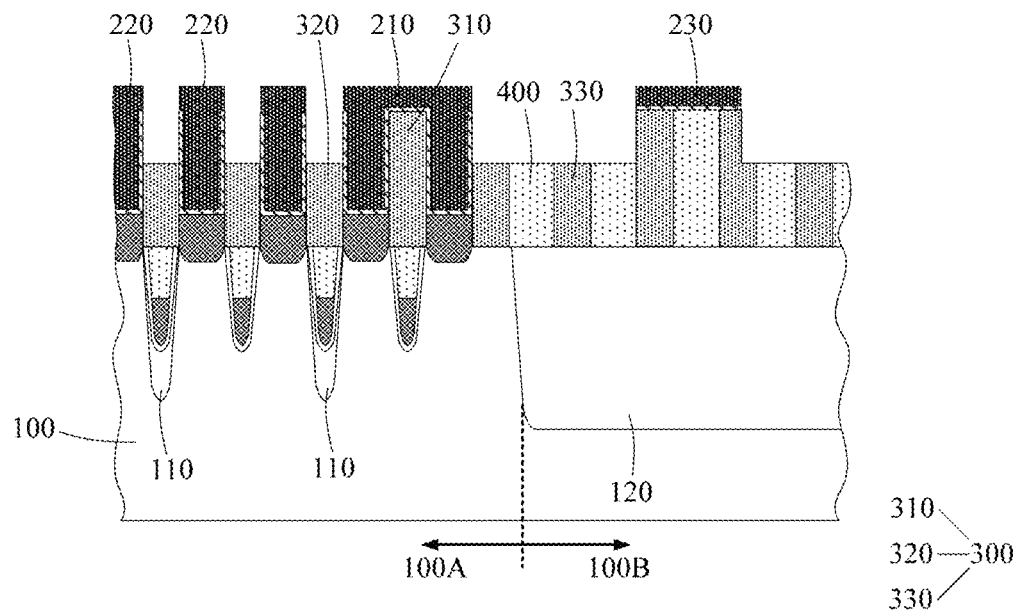

Next, referring to FIG. 3e, in a further scheme, after etching the conductive material layer to expose the isolation pillar 300, it further comprises etching the isolation pillar 300 to a predetermined depth. By further etching the isolation pillar 300 between the adjacent node contacts, the conductive material between the adjacent node contacts can be effectively removed to ensure that the adjacent node contacts are separated from each other.

In this embodiment, the isolation pillar 300 between adjacent independent contacts 220 is exposed, and the isolation pillar 300 between the combined contact 210 and adjacent independent contacts 220 is also exposed, and the isolation pillar between two node contacts in the combined contact 210 is not exposed. Therefore, when etching the isolation pillars 300, the heights of the isolation pillars 300 between adjacent independent contacts 220 and between the combined contact 210 and adjacent independent contacts 220 are reduced, and the second isolation pillars 320 can be formed. In addition, the isolation pillar located between the two node contacts in the combined contact 210 is not etched, and constitutes the first isolation pillar 310 with higher height.

With continued reference to FIG. 3e, in the peripheral region 100B, the electrically conductive layer 230 covers part of the isolation pillars and also extends to cover the adjacent insulation filling pillars 400. Therefore, when etching the isolation pillars 300, the isolation pillars and insulation filling pillars 400 uncovered by the electrically conductive layer 230 are also etched at the same time, so that the heights of the isolation pillars and insulation filling pillars 400 uncovered by the electrically conductive layer 230 are correspondingly reduced. The isolation pillars located in the peripheral region 100B define the third isolation pillars 330.

Furthermore, after etching the isolation pillar 300, a first shielding layer 510 is formed between the independent contacts 220 and between the independent contacts 220 and the combined contact 210.

In this embodiment, when the first shielding layer 510 is formed, a second shielding layer 520 is also formed, and the second shielding layer 520 is at least filled between the electrically conductive layer 230 and the combined contact 210. It should be recognized that when a plurality of electrically conductive layers 230 are formed in the peripheral region 100B, the second shielding layer 520 is also filled between adjacent electrically conductive layers 230.

Example 2

The difference from Embodiment 1 is that in this embodiment, an isolation spacer is formed on the sidewall of the groove between the combined contact and the electrically conductive layer, so that the isolation spacer at least covers the sidewall of the combined contact near the peripheral region.

Figure 4:
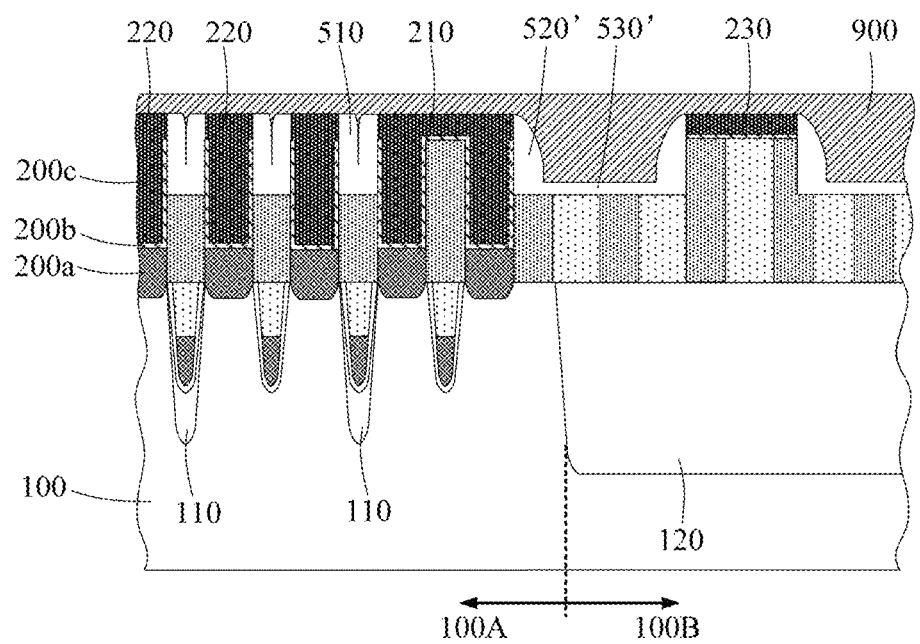
FIG. 4 is a schematic structural diagram of a memory device in the embodiment 2 of the present invention.

FIG. 4 is a schematic structural diagram of the memory device in the embodiment 2 of the present invention. As shown in FIG. 4, the top surfaces of the third isolation pillar and the insulation filling pillar located between the electrically conductive layer 230 and the combined contact 210 are lower, so that a groove can be defined between the electrically conductive layer 230 and the combined contact 210. At this time, part of the sidewall of the combined contact 210 facing the peripheral region will be exposed in the groove. And, if an isolation spacer 520' is formed on the sidewall of the groove, the isolation spacer 520' correspondingly covers at least part of the sidewall of the combined contact 210.

Furthermore, an insulating film layer 530' is formed on the bottom wall of the groove, which covers the top surfaces of the third isolation pillar and the insulation filling pillar in the groove and connects with the bottom of the isolation spacer 520'.

In this embodiment, the isolation spacer 520' and the insulating film layer 530' can be together defined as an U-shaped insulating film layer. The isolation spacer 520' and the insulating film layer 530' may be formed at the same time as the first shielding layer 510 formed in the memory region 100A. Specifically, the forming method of the first shielding layer 510, the isolation spacer 520' and the insulating film layer 530' includes the following steps, for example.

A first step, forming an insulating material layer, wherein the insulating material layer fills the gap between adjacent independent contacts 220, the gap between the independent contacts 220 and the combined contact 210, and at least fills the groove between the combined contact 210 and the electrically conductive layer 230, and the top surface of the insulating material layer also protrudes upward from the top surface of the node contacts.

A second step, performing an etch-back process to remove the portion of the insulating material layer higher than the node contact portion, and leaving the portion of the insulating material layer filled between adjacent independent contacts 220 and the portion filled between the independent contacts 220 and the combined contact 210 to form the first shielding layer 510, and, through the etch-back process, the insulating material layer in the groove is also partially removed to form the isolation spacer 520' on the sidewall of the groove, and part of the insulating material layer is left at the bottom of the groove to form an insulating film layer 530'.

Optionally, after forming the isolation spacer 520', it further includes forming a passivation layer 900, which fills the groove to correspondingly cover the isolation spacer 520' and the insulating film layer 530'. Furthermore, the passivation layer 900 may also cover the first shielding layer 510 and the node contact in the memory region 100A.

Example 3

The difference from Embodiment 2 is that in this embodiment, the top surface of the third isolation pillar covered by the isolation spacer is higher than that of the third isolation pillar not covered by the isolation spacer in the groove not covered by the electrically conductive layer.

Figure 5:
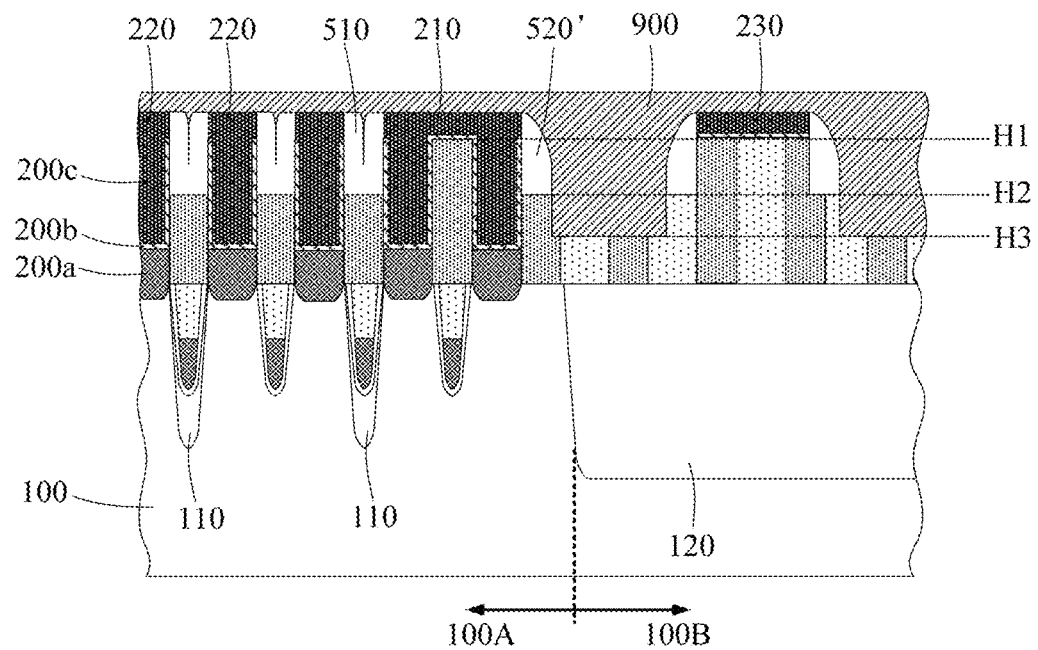
FIG. 5 is a schematic structural diagram of a memory device in the embodiment 3 of the present invention.

FIG. 5 is a schematic structural diagram of the memory device in the embodiment 3 of the present invention. As shown in FIG. 5, the isolation spacer 520' is formed on the sidewall of the groove, and the bottom of the isolation spacer 520' also partially covers the third isolation pillar 330 located in the groove. In the groove, the top surface of the third isolation pillar covered by the isolation spacer 520' is higher than the top surface of the third isolation pillar not covered by the isolation spacer 520'. That is, a plurality of different isolation pillars in this embodiment have at least three different heights.

Specifically, in this embodiment, the top position of the first isolation pillar 310 located between two node contacts in the combined contact 220 is located at the first height position H1, and the top position of the third isolation pillar covered by the electrically conductive layer 230 in the peripheral region 100B is also located at the first height position H1. And, a groove is formed in the area of the peripheral region 100B not covered by the electrically conductive layer 230, and the top position of the third isolation pillar covered by the isolation spacer 520' in the groove is located at the second height position H2, and the top position of the second isolation pillar 320 in the memory region 100A is also located at the second height position H2. Furthermore, the top position of the third isolation pillar in the groove that is not covered by the isolation spacer 520' is located at a third height position H3. The first height position H1 is higher than the second height position H2 and the second height position H2 is higher than the third height position H3.

In this embodiment, in the groove not covering the electrically conductive layer 230, not only the third isolation pillar but also the insulation filling pillar 400 is exposed from the isolation spacer 520'. At this time, similar to the third isolation pillar, in the groove, the top surface of the insulation filling pillar covered by the isolation spacer 520' is higher than that of the insulation filling pillar not covered by the isolation spacer 520'. That is, a plurality of different insulation filling pillars in this embodiment also have at least three different heights correspondingly.

Furthermore, similar to the second embodiment, the isolation spacer 520', and the first shielding layer 510 formed in the memory region 100A can be formed at the same time. Specifically, when the etch-back process is performed, the portion of the insulating material layer covering the bottom of the groove can be completely removed to form the isolation spacer 520' and expose the third isolation pillar and the insulating material layer. And, after exposing the third isolation pillar and the insulating material layer, the third isolation pillar and the insulating material layer may be further etched to reduce the height of the third isolation pillar and the insulating material layer not covered by the isolation spacer 520'; to a third height position H3.

It should be noted that the grooves in this embodiment and the grooves in the embodiment 2 have different opening sizes (specifically, the opening size of the grooves in this embodiment may be larger than that in the embodiment 2). In this way, when the etch-back process is performed to remove the portion of the insulating material layer higher than the node contact portion, the isolation spacer 520' can be formed for the groove with large opening size, and the insulating material layer at the bottom of the groove can be completely removed. And, for a groove with a small opening size, a part of the insulating material layer may remain on the bottom of the groove to form the insulating film layer 530'.

Similarly, after the isolation spacer 520' is formed, a passivation layer 900 may be further formed to fill the groove to correspondingly cover the isolation spacer 520', the third isolation pillar and the insulation filling pillar.

To sum up, in the memory device as described above, two node contact parts filled in two node contact windows at the edge and adjacent to each other in each row are connected to form a combined contact. At this time, it is equivalent to making the width dimension of the combined contact located at the edge position larger than the width dimension of the independent contacts arranged inside. Therefore, when preparing the node contacts, the morphology of the combined contacts can be ensured even if the combined contacts located at the edge position are easily subjected to a large amount of erosion, and under the blocking protection of the combined contacts with a large width, the rest of the node contacts can be prevented from being subjected to a large amount of erosion, so that the morphology accuracy of the independently arranged node contacts can be improved, thereby being beneficial to improving the device performance of the formed memory device.

In a further scheme, the active area at the edge position can also be defined as a non-functional active area, and the node contact part at the edge position can also be connected with the non-functional active area correspondingly. In this case, the node contact part at the edge position can be defined as a non-functional contact part. Therefore, even if the two node contacts located at the edge position are connected with each other, the device performance of the whole memory device will not be affected.

It should be noted that, although the present invention has been disclosed as above with preferred embodiments, the above embodiments are not intended to limit the present invention. For anyone who is familiar with the field, without departing from the scope of the technical scheme of the present invention, many possible changes and modifications can be made to the technical scheme of the present invention by using the technical contents disclosed above, or modified into equivalent embodiments with equivalent changes. Therefore, any simple modifications, equivalent changes and modifications made to the above embodiments according to the technical essence of the present invention, without departing from the contents of the technical scheme of the present invention, still fall within the scope of protection of the technical scheme of the present invention.

It should also be understood that, unless otherwise specified or pointed out, the descriptions of the terms "first", "second" and "third" in the specification are only used to distinguish various components, elements and steps in the specification, and are not used to express the logical relationship or sequential relationship among various components, elements and steps.

Furthermore, it should be recognized that the terms described herein are only used to describe specific embodiments, and are not used to limit the scope of the invention. It must be noted that the singular forms "a" and "an", as used herein and in the appended claims, include plural references unless the context clearly indicates a contrary meaning. For example, a reference to "one step" or "one device" means a reference to one or more steps or devices, and may include secondary steps and secondary devices. All conjunctions used should be understood in the broadest sense. And, the word "or" should be understood as having the definition of logical "or" instead of logical "exclusive or", unless the context clearly indicates the opposite meaning. In addition, the implementation of the method and/or device in the embodiment of the present invention may include performing the selected tasks manually, automatically or in combination.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device, comprising:
   a substrate, a memory region and a peripheral region are defined thereon, the peripheral region being located outside the memory region;
   a plurality of isolation pillars formed on the substrate and at least located in the memory region for defining a plurality of node contact windows in the memory region of the substrate; and
   a plurality of node contacts, the plurality of node contacts fill the node contact windows and arranged in a plurality of rows, wherein no greater than two of the plurality of node contacts filled in two adjacent node contact windows are connected with each other and to form a combined contact, and a plurality of the node contacts located beside the combined contact are defined as a plurality of independent contacts, and each independent contact is filled with a node contact window, wherein all of the independent contacts and the combined contact are disposed only in the memory region.

2. The memory device according to claim 1, wherein the isolation pillars are disposed between adjacent node contacts;

wherein an isolation pillar disposed under the combined contact is defined as a first isolation pillar, and the two node contacts of the combined contact are connected with each other on a top surface of the first isolation pillar.

3. The memory device according to claim 2, wherein the isolation pillar disposed between adjacent independent contacts are defined as a second isolation pillar, and a top surface of the second isolation pillar is lower than a top surface of each independent contact.

4. The memory device according to claim 1, wherein an isolation pillar disposed under the combined contact is defined as a first isolation pillar, and a top surface of the first isolation pillar is higher than a top surface of the second isolation pillar.

5. The memory device according to claim 1, wherein the isolation pillars are further formed in the peripheral region, and the isolation pillars disposed in the peripheral region are defined as a plurality of third isolation pillars, and at least one insulation filling pillar is disposed between two adjacent third isolation pillars.

6. The memory device according to claim 5, further comprising:
an electrically conductive layer formed on at least part of the third isolation pillars, wherein a top surface of part of the third isolation pillars covered by the electrically conductive layer is higher than a top surface of another part of the third isolation pillars not covered by the electrically conductive layer.

7. The memory device according to claim 6, wherein the top surface of parts of the third isolation pillars and the top surface of parts of the insulation filling pillars located are lower than the top surface of the electrically conductive layer and the top surface of the combined contact, so as to define a groove between the electrically conductive layer and the combined contact.

8. The memory device according to claim 7, further comprising:
a first shielding layer, wherein the first shielding layer is at least filled between the adjacent independent contacts and positioned on the second isolation pillar; and
a second shielding layer, wherein the second shielding layer is at least filled in the groove between the electrically conductive layer and the combined contact.

9. The memory device according to claim 5, further comprising:
an U-shaped insulating film layer disposed beside the combined contact, wherein the U-shaped insulating film layer covers the top surface of the third isolation pillar and the top surface of the insulation filling pillar.

10. The memory device according to claim 5, further comprising:
at least one isolation spacers disposed beside the combined contact, and the at least one isolation spacers covers parts of the third isolation pillars, wherein the top surface of the third isolation pillar covered by the isolation spacer is higher than the top surface of the third isolation pillar not covered by the isolation spacer.

11. A method for forming a memory device, comprising:
forming a substrate, a memory region and a peripheral region are defined thereon, the peripheral region being located outside the memory region;
forming a plurality of isolation pillars formed on the substrate and at least located in the memory region for defining a plurality of node contact windows in the memory region of the substrate; and
forming a plurality of node contacts, the plurality of node contacts fill the node contact windows and arranged in a plurality of rows, wherein no greater than two of the plurality of node contacts filled in two adjacent node contact windows are connected with each other and to form a combined contact, and a plurality of the node contacts located beside the combined contact are defined as a plurality of independent contacts, and each independent contact is filled with a node contact window, wherein all of the independent contacts and the combined contact are disposed only in the memory region.

12. The method according to claim 11, wherein the isolation pillars are disposed between adjacent node contacts;
wherein an isolation pillar disposed under the combined contact is defined as a first isolation pillar, and the two node contacts of the combined contact are connected with each other on a top surface of the first isolation pillar.

13. The method according to claim 12, wherein the isolation pillar disposed between adjacent independent contacts are defined as a second isolation pillar, and a top surface of the second isolation pillar is lower than a top surface of each independent contact.

14. The method according to claim 11, wherein an isolation pillar disposed under the combined contact is defined as a first isolation pillar, and a top surface of the first isolation pillar is higher than a top surface of the second isolation pillar.

15. The method according to claim 11, wherein the isolation pillars are further formed in the peripheral region, and the isolation pillars disposed in the peripheral region are defined as a plurality of third isolation pillars, and at least one insulation filling pillar is disposed between two adjacent third isolation pillars.

16. The method according to claim 11, further comprising:
forming an electrically conductive layer formed on at least part of the third isolation pillars, wherein a top surface of part of the third isolation pillars covered by the electrically conductive layer is higher than a top surface of another part of the third isolation pillars not covered by the electrically conductive layer.

17. The method according to claim 16, wherein the top surface of parts of the third isolation pillars and the top surface of parts of the insulation filling pillars located are lower than the top surface of the electrically conductive layer and the top surface of the combined contact, so as to define a groove between the electrically conductive layer and the combined contact.

18. The method according to claim 17, further comprising:
forming a first shielding layer, wherein the first shielding layer is at least filled between the adjacent independent contacts and positioned on the second isolation pillar; and
forming a second shielding layer, wherein the second shielding layer is at least filled in the groove between the electrically conductive layer and the combined contact.

19. The method according to claim 15, further comprising:
forming an U-shaped insulating film layer beside the combined contact, wherein the U-shaped insulating film layer covers the top surface of the third isolation pillar and the top surface of the insulation filling pillar.

20. The method according to claim 15, further comprising:
- forming at least one isolation spacers beside the combined contact, and the at least one isolation spacers covers parts of the third isolation pillars, wherein the top surface of the third isolation pillar covered by the isolation spacer is higher than the top surface of the third isolation pillar not covered by the isolation spacer.

* * * * *